US012781347B2

(12) United States Patent
Oosterlaken et al.

(10) Patent No.: US 12,781,347 B2
(45) Date of Patent: Nov. 3, 2026

(54) GAS INJECTOR

(71) Applicant: ASM IP Holding B.V., Almere (NL)

(72) Inventors: Theodorus G.M. Oosterlaken, Oudewater (NL); Bert Jongbloed, Oud-Heverlee (BE); Radko Bankras, Almere (NL); Bart Lindeboom, Blaricum (NL)

(73) Assignee: ASM IP Holding B.V., Almere (NL)

( * ) Notice: Subject to any disclaimer, the term of this patent is extended or adjusted under 35 U.S.C. 154(b) by 332 days.

(21) Appl. No.: 18/508,949

(22) Filed: Nov. 14, 2023

(65) Prior Publication Data

US 2024/0167157 A1 May 23, 2024

Related U.S. Application Data

(60) Provisional application No. 63/384,331, filed on Nov. 18, 2022.

(51) Int. Cl.
*C23C 16/455* (2006.01)
*H10P 72/00* (2026.01)

(52) U.S. Cl.
CPC .... *C23C 16/45572* (2013.01); *H10P 72/0402* (2026.01)

(58) Field of Classification Search
CPC .................... C23C 16/45572; C23C 16/45578
See application file for complete search history.

(56) References Cited

U.S. PATENT DOCUMENTS

| | | | | |
|---|---|---|---|---|
| 8,409,353 | B2 | 4/2013 | Yokota | |
| 2005/0098107 | A1* | 5/2005 | Du Bois | C23C 16/4584 118/715 |
| 2011/0011341 | A1* | 1/2011 | Nishimoto | C23C 16/45572 239/132.3 |
| 2012/0031332 | A1 | 2/2012 | Yokota | |
| 2015/0007771 | A1* | 1/2015 | Silva | C23C 16/45572 118/715 |
| 2015/0211113 | A1* | 7/2015 | Nakajima | C23C 16/4402 118/724 |
| 2021/0156029 | A1* | 5/2021 | Verbaas | C23C 16/46 |

FOREIGN PATENT DOCUMENTS

| | | | |
|---|---|---|---|
| CA | 1251100 | A | 3/1989 |
| JP | 2013131485 | A | 7/2013 |

* cited by examiner

*Primary Examiner* — Joseph A Miller, Jr.
(74) *Attorney, Agent, or Firm* — Banner & Witcoff, Ltd.

(57) ABSTRACT

A gas injector and a semiconductor processing apparatus comprising the gas injector are disclosed. Embodiments of the presently described gas injector comprise an injector tube to inject a process gas to a process chamber of the semiconductor processing apparatus. The gas injector further comprises a cooling fluid conduit constructed and arranged to cool the injector tube.

20 Claims, 8 Drawing Sheets

GAS INJECTOR

CROSS-REFERENCE TO RELATED APPLICATION(S)

Figure 1A:
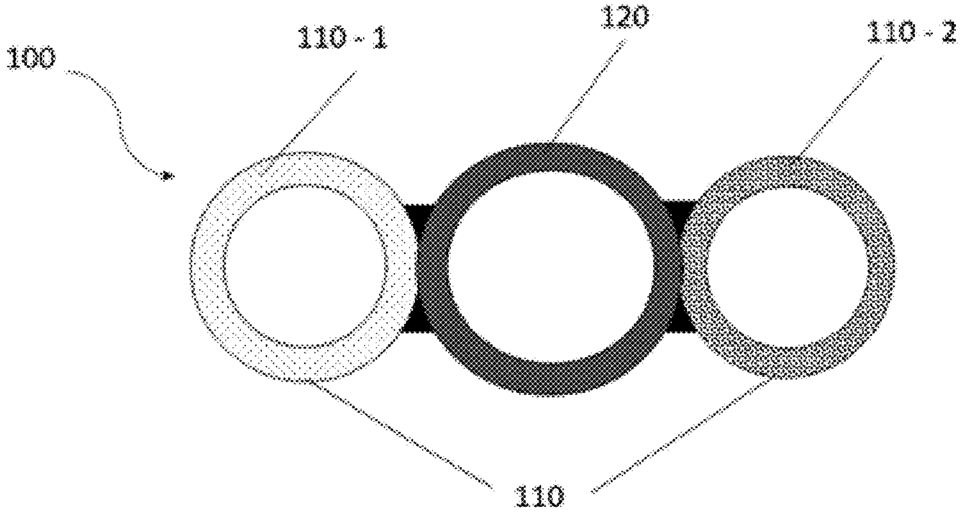

This application claims the benefit of U.S. Provisional Application 63/384,331 filed on Nov. 18, 2022, the entire contents of which are incorporated herein by reference.

FIELD OF INVENTION

The present disclosure relates to a gas injector. More specifically, it relates to a gas injector for a semiconductor processing apparatus.

BACKGROUND OF THE DISCLOSURE

Advances in semiconductor industry are leading to developments both in device architectures and semiconductor processes; however these developments bring along also new challenges, particularly in terms of the semiconductor processes.

Depositions of films on substrates require the use of one or more precursors. These precursors may be in liquid, solid or gaseous form. Precursors in gaseous form may be provided into the process chamber of semiconductor processing apparatuses through use of gas injectors.

One of the challenges regarding the use of gas injectors may be to reduce the deposition that may take place inside the gas injector. Deposition inside the gas injector may be a source of particle contamination, as increasing thickness of the deposited film inside the gas injector may lead to cracking of the injector. This may be overcome by replacing the gas injector after failure, however; this may lead to a reduced preventive maintenance cycle for the gas injector and thereby, reducing the process throughput.

Therefore, there may be a need to provide an improved gas injector for semiconductor processing apparatuses.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It may be an object of the present disclosure to provide a gas injector for use in a semiconductor processing apparatus.

In a first aspect the present disclosure relates to a gas injector. The gas injector may be constructed to deliver a process gas to a process chamber of a semiconductor processing apparatus. The gas injector may comprise an injector tube to inject a process gas to the process chamber. The injector tube may extend along a first axis in a longitudinal direction from a first end to a second end. The injector tube may be constructed to receive the process gas and to inject the process gas to the process chamber along a second axis. The second axis may be substantially perpendicular to the first axis. The gas injector may further comprise a cooling fluid conduit constructed to cool the injector tube.

The gas injector according to embodiments of the first aspect of the present disclosure may allow for improving its lifetime. This may thereby contribute to further improvement of the process performance of the semiconductor processing apparatus.

It may be an advantage of embodiments of the first aspect that the preventive maintenance cycle of the gas injector may be increased.

It may be an advantage of embodiments of the first aspect that the gas injector may be kept cooler during processing, thereby decreasing the rate of film deposition on the inner walls of the injector tube.

It may further be an advantage of embodiments of the first aspect that the risk for cracking and/or breakage of the gas injector tube may be reduced.

It may be an advantage of embodiments of the first aspect that particle formation in the gas injector may be reduced.

It may be an advantage of embodiments of the first aspect that the need for cleaning or etching the deposited film on the inner walls of the injector tube may be reduced thanks to decreased rate of film deposition on the inner walls of the injector tube.

In a second aspect, the present disclosure relates to another gas injector. The gas injector may be constructed to deliver a process gas to a process chamber of a semiconductor processing apparatus. The gas injector may comprise an injector tube to inject a process gas to the process chamber. The injector tube may extend along a first axis in a longitudinal direction from a first end to a second end. The injector tube may be constructed to receive the process gas and to inject the process gas to the process chamber substantially along the first axis. The gas injector may further comprise a cooling fluid conduit. The cooling fluid conduit may be constructed to cool the injector tube. The cooling fluid conduit may comprise a cooling fluid supply conduit and a cooling fluid return conduit that may be constructed and arranged to provide and to remove a cooling fluid. Each of the cooling fluid supply conduit and the cooling fluid return conduit may be coaxially positioned with the injector tube. The cooling fluid supply conduit may be positioned in between the injector tube and the cooling fluid return conduit.

The gas injector according to embodiments of the second aspect of the present disclosure may allow for improving its lifetime. This may thereby, contribute to further improvement of the process performance of the semiconductor processing apparatus.

It may be an advantage of embodiments of the second aspect that the preventive maintenance cycle of the gas injector may be increased.

It may be an advantage of embodiments of the second aspect that the gas injector may be kept cooler during processing, thereby decreasing the rate of film deposition on the inner walls of the injector tube.

It may further be an advantage of embodiments of the second aspect that the risk for cracking and/or breakage of the gas injector tube may be reduced.

It may be an advantage of embodiments of the second aspect that particle formation in the gas injector may be reduced.

It may be an advantage of embodiments of the second aspect that the need for cleaning or etching the deposited film on the inner walls of the injector tube may be reduced thanks to decreased rate of film deposition on the inner walls of the injector tube.

In a third aspect, the present disclosure relates to a semiconductor processing apparatus. The semiconductor processing apparatus may comprise a process chamber extending in a longitudinal direction. The process chamber may be constructed and arranged for receiving a substrate boat. The substrate boat may comprise a plurality of substrates. The apparatus may be provided with the gas injector according to embodiments of the first aspect or the second aspect of the present disclosure.

The semiconductor processing apparatus according to embodiments of the third aspect of the present disclosure may provide improved process performance. This may be thanks to the gas injector comprised in the apparatus, which may be kept cooler during processing.

It may be an advantage of embodiments of the third aspect that it may allow for improved process throughput thanks to the gas injector comprised in the apparatus with improved life time.

It may be an advantage of embodiments of the third aspect that it may allow for processing a plurality of substrates all at a time with, whereby particle formation may be reduced.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

Like reference numbers will be used for like elements in the drawings unless stated otherwise. Reference signs in the claims shall not be understood as limiting the scope.

Figure 1B:
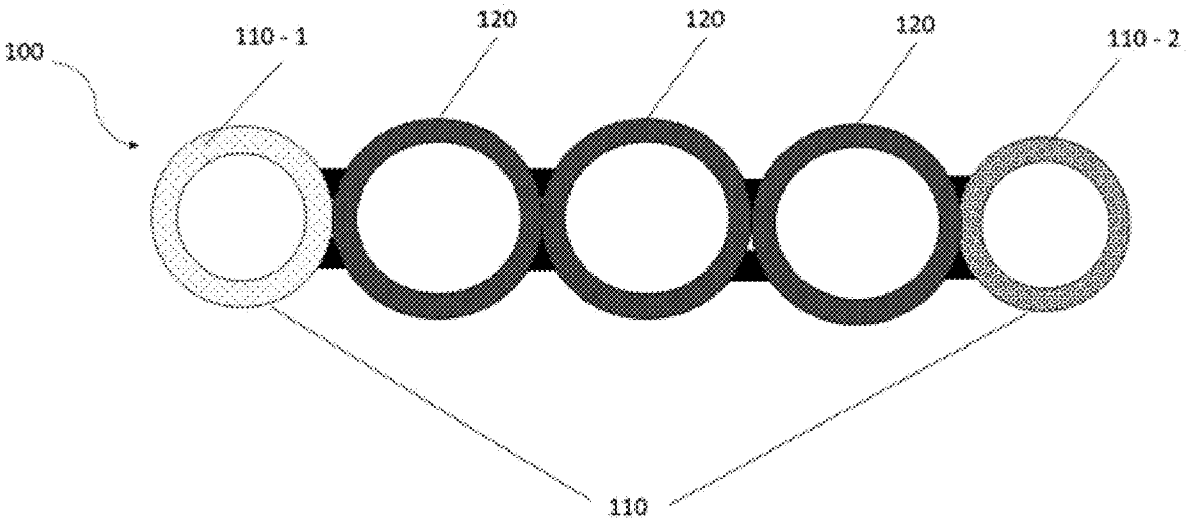

FIGS. 1A and 1B: A schematic top view of a gas injector according to embodiments of the first aspect of the present disclosure.

Figure 2:
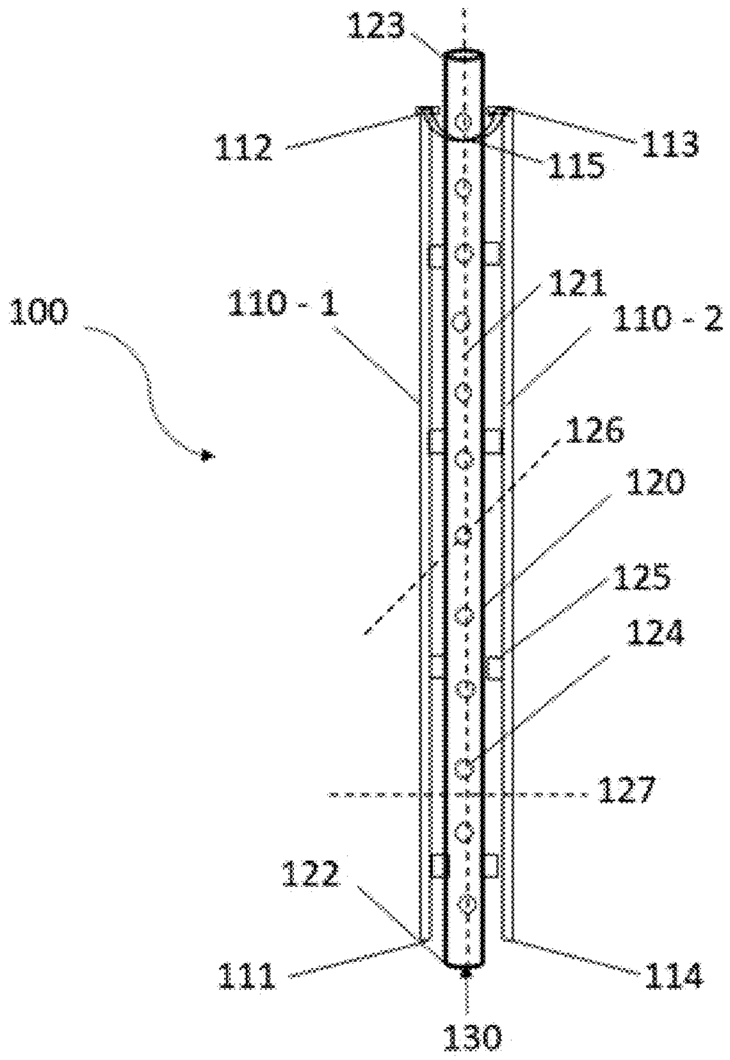

FIG. 2: A schematic front view of a multi-hole gas injector according to embodiments of the first aspect of the present disclosure.

Figure 3B:
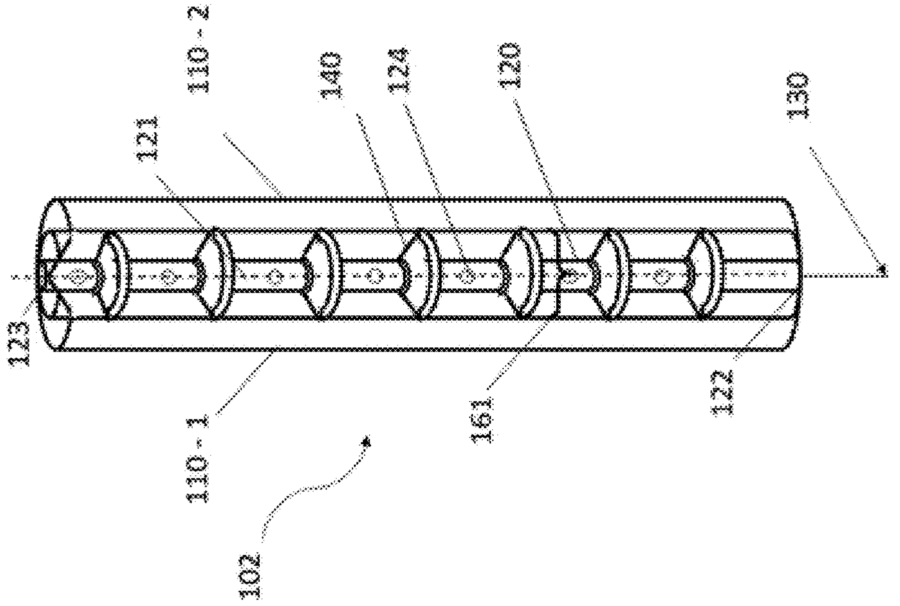
Figure 3A:
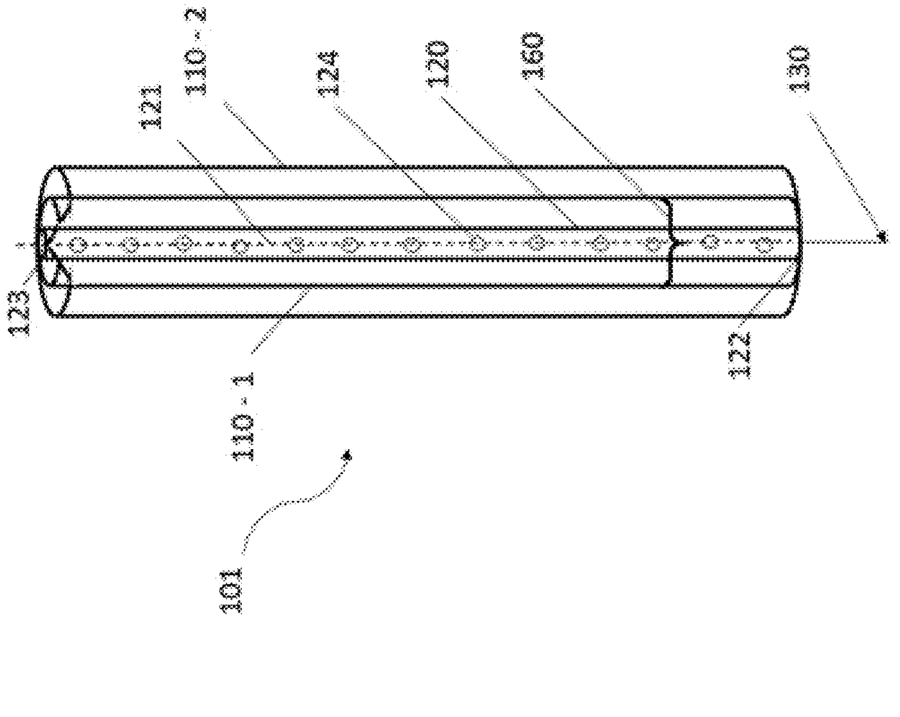

FIGS. 3A and 3B: A schematic front view of a multi-hole gas injector according to embodiments of the first aspect of the present disclosure—FIG. 3A having a longitudinal opening along a length of the gas injector, and FIG. 3B having interrupted openings along a length of the gas injector.

Figure 4A:
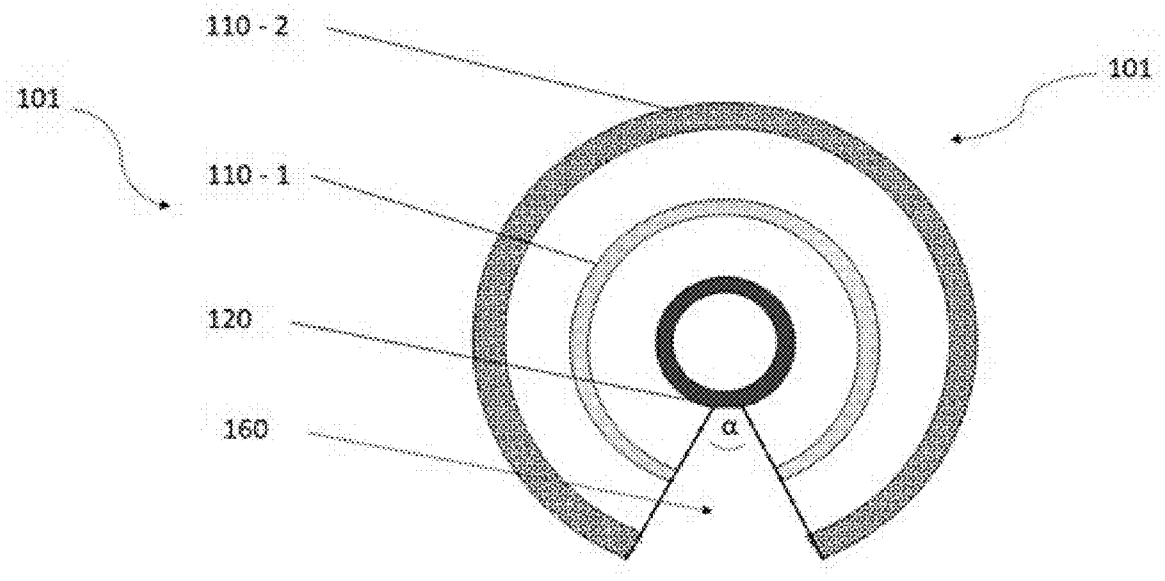
Figure 4B:
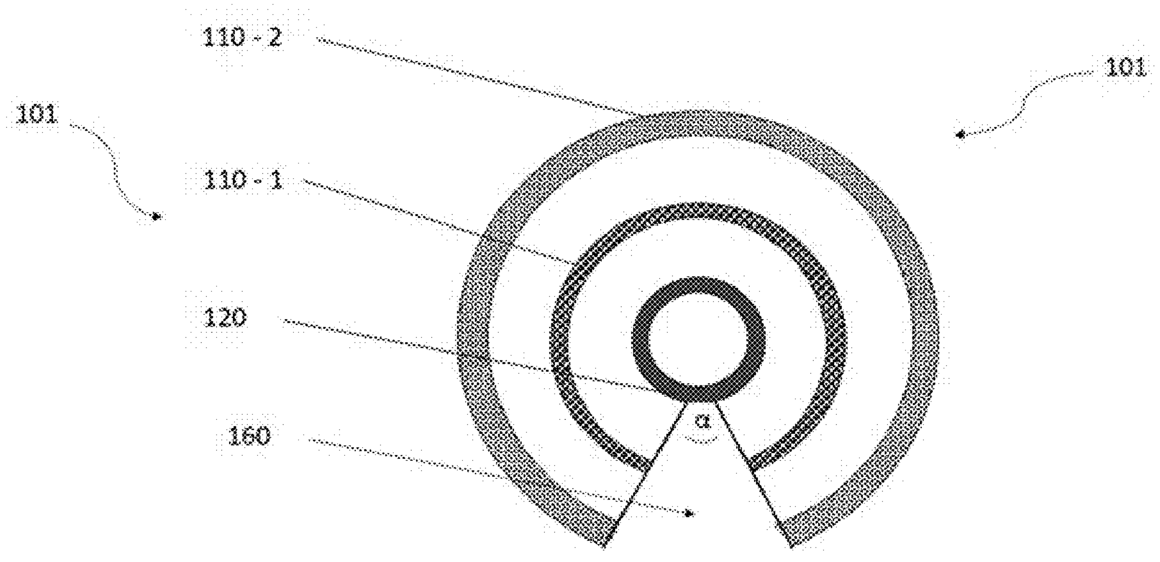
Figure 4C:
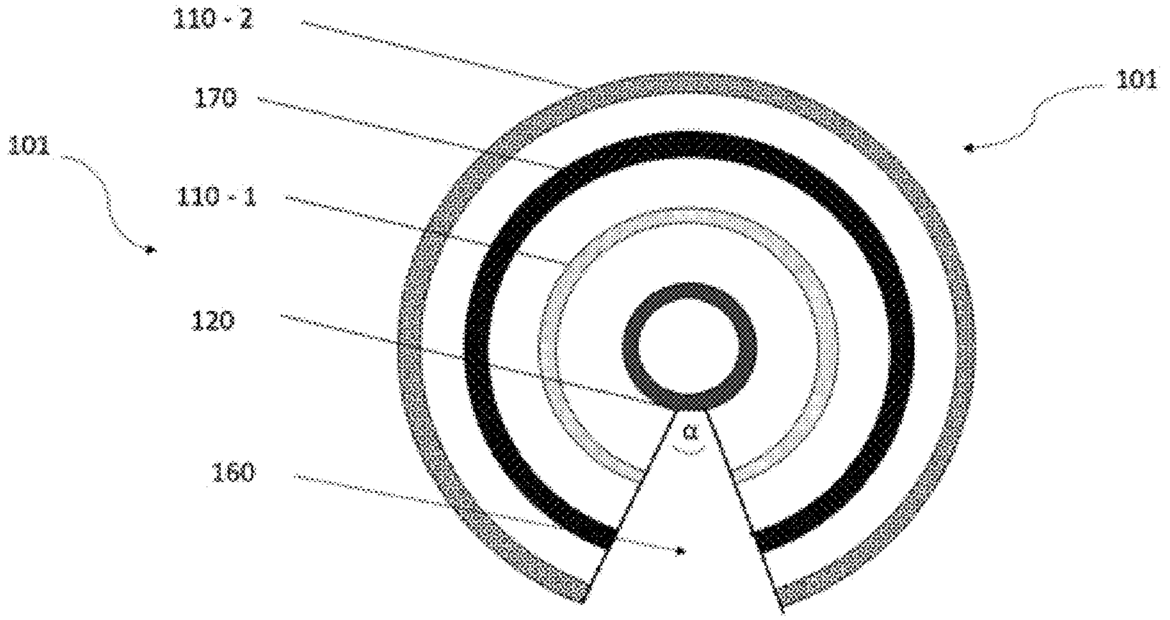
Figure 5:
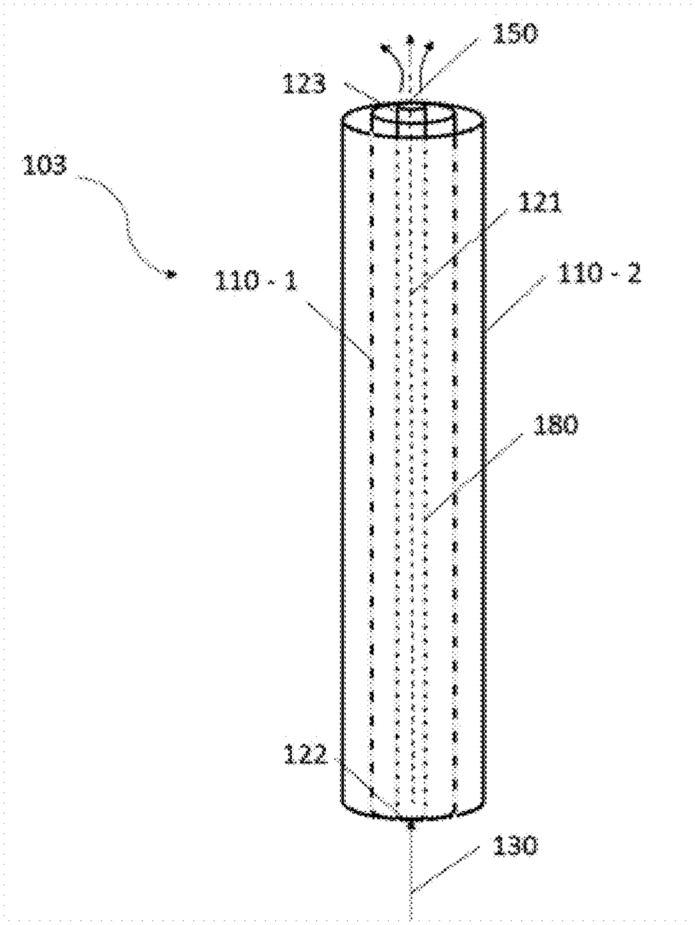

FIGS. 4A-4C: A schematic top view of a multi-hole gas injector according to embodiments of the first aspect of the present disclosure FIG. 5: A schematic front view of a dump gas injector according to embodiments of the second aspect of the present disclosure.

FIGS. 6A-6E: A schematic top view of a dump gas injector according to embodiments of the second aspect of the present disclosure.

Figure 7:
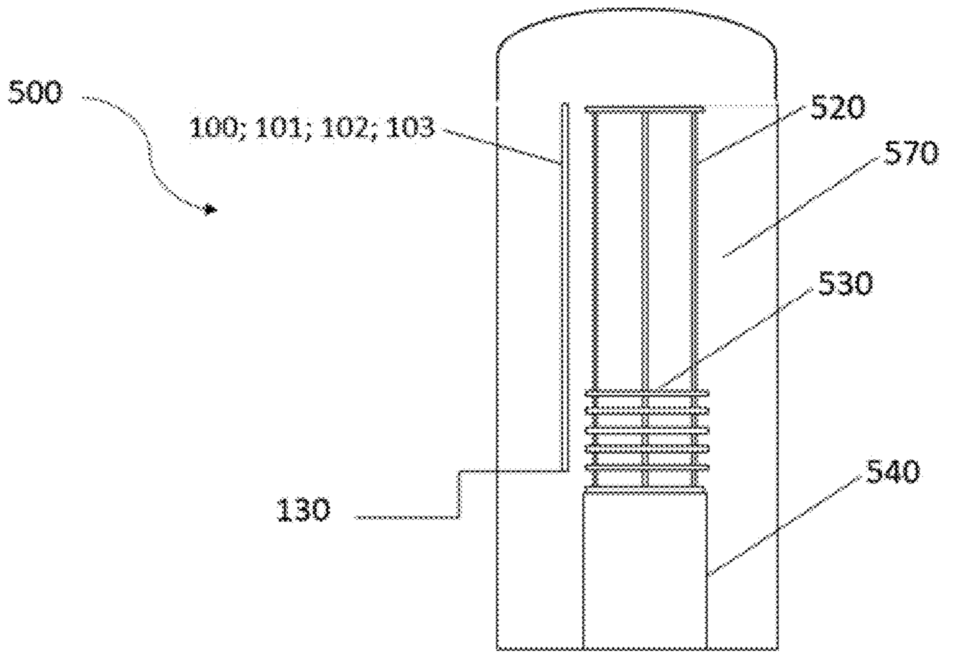

FIG. 7: A schematic representation of a semiconductor processing apparatus according to embodiments of the third aspect of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof It is to be noticed that the term "comprising", as used herein, should not be interpreted as being restricted to the means listed thereafter. It does not exclude other elements or steps. It is thus, to be interpreted as specifying the presence of the stated features, steps or components as referred to. However, it does not prevent one or more other steps, components, or features, or groups thereof from being present or being added.

Reference throughout the specification to "embodiments" in various places are not necessarily all referring to the same embodiment, but may. Furthermore, the particular features, structures or characteristics maybe combined in any suitable manner, as would be apparent to one of the ordinary skill in the art from the disclosure, in one or more embodiments.

Reference throughout the specification to "some embodiments" means that a particular structure, feature step described in connection with these embodiments is included in some of the embodiments of the present invention. Thus, phrases appearing such as "in some embodiments" in different places throughout the specification are not necessarily referring to the same collection of embodiments, but may.

The following terms are provided only to help in the understanding of the disclosure.

As used herein and unless provided otherwise, the term "preventive maintenance cycle" may refer to a regular and routine control and maintenance of a unit, device, apparatus in an effort to make sure that it functions the way it is designed for.

As used herein and unless provided otherwise, the term "pitch value of the process gas injection holes" may refer to a sum of the diameter of one of the process gas injection holes and the spacing between that process gas injection hole and an adjacent one.

As used herein and unless provided otherwise, the term "matrix configuration" may refer to a configuration of structures arranged in a number of rows and columns, the number of rows and column being the same as or different from one another.

As used herein and unless provided otherwise, the term "dump gas injector" may refer to a gas injector having an injector tube with a single opening at its distal end for injecting a process gas into a process chamber, the distal end corresponding to the second end of the injector tube.

As used herein and unless provided otherwise, the term "semiconductor processing apparatus down-time" may refer to the period of time where the apparatus is dysfunctional.

The disclosure will now be described by a detailed description of several embodiments of the disclosure. It is clear that other embodiments of the disclosure can be configured according to the knowledge of persons skilled in the art in the absence of departure from the technical teaching of the disclosure. The disclosure is limited only by the terms of the claims included herein.

We now return to FIG. 1A, FIG. 1B, and FIG. 2 representing schematically a top view and a front view of a gas injector according to embodiments of the first aspect of the present disclosure.

The gas injector (100, 101, 102) may be constructed to deliver a process gas to a process chamber of a semiconductor processing apparatus.

In embodiments, the semiconductor processing apparatus may be an apparatus for depositing a layer of a metal, a layer of a semiconducting material, for forming a layer of an oxide, for forming a layer of nitride or for forming a layer of carbide on at least one substrate.

The gas injector (100, 101, 102) may comprise an injector tube (120). The injector tube (120) may be suitable for injecting a process gas to the process chamber. The injector tube (120) may extend along a first axis (121) in a longitudinal direction from a first end (122) to a second end (123), whereby the injector tube (120) may be constructed to receive the process gas and to inject the process gas to the process chamber along the second axis (126). The second axis (126) may substantially be perpendicular to the first axis (121).

In some embodiments, the longitudinal direction can be in a vertical direction. The vertical direction may be perpendicular with reference to the ground that the semiconductor processing apparatus is located. The semiconductor processing apparatus may thus, have a vertically oriented process chamber. Therefore, in embodiments, the process chamber may extend along the first axis (121) in the longitudinal direction, the longitudinal direction being the vertical direction. The process chamber may further be constructed and arranged for receiving a substrate boat comprising a plurality of substrates. The substrate boat may be loadable into the process chamber along the first axis (121) in the longitudinal direction.

In some embodiments, the longitudinal direction can be in a horizontal direction. The horizontal direction may be parallel with reference to the ground that the semiconductor processing apparatus is located. The semiconductor processing apparatus may thus, have a horizontally oriented process chamber.

In embodiments, the injector tube (120) may comprise a feed end for receiving the process gas. In embodiments, the feed end may be in fluid connection with a gas supply (130) constructed and arranged to provide one or more precursor gas to the injector tube (120). In embodiments, the feed end may be comprised in the first end (122) of the injector tube (120). The one or more precursor gas may make up the process gas. In embodiments where more than one precursor gas is supplied to the injector tube (120), the precursor gases may get mixed in the injector tube (120) before being injected into the process chamber.

The gas injector (100) may further comprise a cooling fluid conduit (110) that may be constructed to cool the injector tube (120).

The gas injector (100, 101, 102) according to embodiments of the first aspect of the present disclosure may advantageously offer an improved lifetime. This may be thanks to cooling to the gas injector when in use. Improved lifetime of the gas injector may advantageously lead to reduced number of maintenance interruptions, thereby allowing for improved process performance. This may also advantageously lead to improved process throughput.

The gas injector in the process chamber typically has, in use, the same temperature as the substrates being processed in the process chamber. This may, thus, undesirably lead to deposition of the same film by the process gas on the inner walls of the injector tube (120) as that deposited on the substrates. The cooling provided, in use, to the gas injector, may thus, allow for lowering the rate of deposition of film by the process gas in the injector tube (120) on its inner walls. Lowered rate of deposition may slow down the increase in the thickness of the film deposited on the inner walls of the injector tube (120). This may in return make the injector tube (120) less prone to frequent imminent cracks or occurrence of breakage of the gas injector since increased film thickness may lead to tensile or compressive stress build up on the inner walls of the injector tube (120), thereby, resulting in the cracks or breakage.

The gas injector (100, 101, 102) to embodiments of the first aspect may therefore, be advantageous for processes, where gas injector lifetime may be a major limiting factor for process performance.

The build-up of compressive or tensile stress may also play a role on particle formation in cases where the deposited film on the inner walls of the injector tube (120) cracks. Therefore, slowing down the rate of deposition of the film may result in slowing down the increase in the thickness of the film on the inner walls of the injector tube (120). This may inherently provide the advantage of delaying the occurrence of cracking of the film as the risk of cracking may be increased with increasing film thickness.

With the slowing down of the increase in film thickness on the inner walls of the injector tube (120), the need for cleaning or etching the deposited film on the inner walls of the injector tube may be reduced. In other words, the time interval between cleaning or etching operations in an effort to remove the deposited film from the inner walls of the injector tube may be prolonged. This may, in return, also contribute to improving process performance since the frequency of the semiconductor processing apparatus downtime may be reduced.

In embodiments, the gas injector (100) may comprise a plurality of injector tubes (120). This may advantageously allow for improving the thickness uniformity of the layer to be formed over the surface of each of the substrates that may be comprised in the substrate boat.

In some embodiments, the plurality of injector tubes (120) may be aligned next to each other along a third axis (127), the third axis (127) being perpendicular to the first axis (121) and the second axis (126). The cooling fluid conduits (110), such as for example the cooling fluid supply conduit (110-1) and the cooling fluid return conduit (110-2), may be positioned opposite to one another on each of the distal ends of the plurality of injector tubes aligned next to each other as schematically represented in FIG. 1B. It is to be noted that there is to be enough conduction between each of the plurality of the gas injectors (120) with one another such that the heat from the injector tubes (120) can be transferred to the cooling fluid conduits (110).

The number of the injector tubes (120) that can be aligned next to each other may be configured such that there is provided enough cooling to each of the injector tubes (120). In some embodiments, there may be a need to place additional cooling fluid channels above and/or below the aligned injector tubes (120) (not shown in the figures).

In some embodiments, the plurality of injector tubes (120) may be aligned on top of one another along the first axis (121) in the longitudinal direction. The number of the plurality of injector tubes (120) may then be configured such that they cover an equal distance of the substrate boat length. This may be advantageous for providing an equal distribution of the process gas along the height of the substrate boat. This may then further allow for improving the thickness uniformity of the layer to be deposited on each substrate in the substrate boat.

In embodiments, the injector tube (120) may comprise a plurality of process gas injection holes (124). The process gas injection holes (124) may be suitable to inject the process gas to the process chamber along the second axis (126). The process gas injection holes (124) may be spaced apart from one another along the first axis (121) in the longitudinal direction.

The process gas injection holes (124) may be aligned collinearly in the injector tube (120) along the first axis (121). This may distribute the process gas to the process chamber in an equilibrated manner in the longitudinal direction along the first axis (121).

In some embodiments, the process gas injection holes (124) may be equally separated from one another along the height of the injector tube (101), which may also infer that the distance between center points of each of the holes (124) along the longitudinal direction may be the same. In some embodiments, the distance between center points of each of the holes (124) may vary along the longitudinal direction.

The size of the process gas injection holes (124) may play an important role in distributing the process gas in the process chamber. The pressure inside the gas injector may be higher than that in the process chamber so as to provide equilibrated flow through each of the process gas injection holes (124). However, the higher pressure inside the injector may be responsible for high deposition rates on the inner walls of the injector tube (120), thereby, leading to faster thickening of the deposited film therein. In an effort to reduce the pressure inside the gas injector may be to increase the size of the process gas injection holes (124). However, this may run the risk of decreasing the equilibrated distribution through the holes (124). From this point of view, the gas injector according to embodiments of the first aspect of the present disclosure may provide the advantage of keeping equilibrated flow while helping to reduce deposition rate in the gas injector.

In embodiments, the diameter of each of the process gas injection holes (124) may substantially be the same.

In some embodiments, the diameter of the each of the process gas injection holes may be in a range of 1 mm to 1.5 mm. In these embodiments, the pitch value may be in a range of 20 mm to 35 mm.

In some embodiments, the diameter of the each of the process gas injection holes may be in a range of 4 mm to 6 mm. In these embodiments, the pitch value may be in a range of 15 mm to 200 mm.

In embodiments, the cooling fluid conduit may comprise a cooling fluid supply conduit (110-1) and a cooling fluid return conduit (110-2) constructed and arranged to provide and to remove a cooling fluid.

The provision and removal of the cooling fluid may take place in a continuous mode when the gas injector (100) is in operation. Continuous provision and removal of the cooling fluid may allow for keeping the gas injector at a steady state temperature that may provide reduced deposition rate on the inner walls of the injector tube (120).

In embodiments, the cooling fluid may be a liquid, a liquid mixture, a gas or a gas mixture.

In some embodiments, the cooling fluid may be water.

The percentage of cooling provided by the cooling fluid conduits (110) may depend on the process temperature.

In embodiments, a diameter of the cooling fluid supply conduit (110-1) may be the same as or different from the cooling fluid return conduit (110-2). This may provide flexibility in designing the cooling fluid conduit so as to provide the cooling needed to the gas injector.

In embodiments, the diameter of the cooling fluid conduits (110) may refer to the inner diameter. Inner diameter may play a role in determining the cooling rate and the flow rate of the cooling fluid that can be sent through.

In embodiments, where the diameter of the cooling fluid supply conduit (110-1) may be the same as the cooling fluid return conduit (110-2), cross section of each of the conduits (110) may be different from one another. The difference in cross section of the conduits (110) may be configured such that the heat transfer between the supply conduit (110-1) and the injector tube (120) is higher than the heat transfer between the return conduit (110-2) and the injector tube (120). This may have the advantage of providing cooling to the injector tube (120) by the incoming cooling fluid in the supply conduit (110-1) and minimizing the heat transfer between return conduit (110-2) and the injector tube (120) that may be due to the heated cooling fluid running in the return conduit (110-2). Furthermore, the difference in cross section may take care of withstanding the pressure inside the conduits (110). This may, for example, be adjusted by varying the wall thickness of each of the conduits.

In some embodiments, the diameter of the cooling fluid supply conduit (110-1) may be different from that of the cooling fluid return conduit (110-2). This may particularly be advantageous when there is a phase change in the cooling fluid. In embodiments, where the cooling fluid is water, then water in the cooling fluid supply conduit may for example, become steam in the cooling fluid return conduit depending on the process temperature.

In some embodiments, the diameter of the cooling fluid return conduit (110-2) may be smaller than the diameter of the cooling fluid supply conduit (110-1). Smaller diameter of the cooling fluid return conduit (110-2) may help to increase the flow rate of the cooling fluid in the return conduit (110-2).

Each of the cooling fluid supply conduit (110-1) and the cooling fluid return conduit (110-2) may be positioned on either side of the injector tube (120) along the first axis (121) in the longitudinal direction.

In embodiments, the positioning of the cooling fluid supply conduit (110-1) and the cooling fluid return conduit (110-2) around the injector tube (120) may be at 180° with respect to one another. Thus, the cooling fluid supply conduit (110-1), the injector tube (120) and the cooling fluid return conduit (110-2) may be aligned with each other along the third axis (127), the third axis (127) being perpendicular to the first axis (121) and the second axis (126) (FIG. 2). In other words, the cooling fluid supply conduit (110-1) may be positioned opposite to the cooling fluid return conduit (110-2).

In some embodiments, the injector tube (120) may be made of metal. This may allow for providing improved cooling to the gas injector (100).

In some embodiments, the injector tube (120) may be made of quartz or silicon carbide. The choice of material of the injector tube (120) may depend on the process temperature. The higher the process temperature is, the cooler the injector tube (120) may need to be kept.

In embodiments, the cooling fluid conduit (110) may have an inverse-U shape as schematized in FIG. 2. This may provide the advantage of making the connections to the cooling fluid conduits (110) easier as the flange is located at a lower part of the process chamber. The flange may help to create a closed space in the process chamber for the processing of the substrates. The flange may be provided with an inlet opening for access of a substrate boat comprising the substrates. Other shapes regarding the cooling fluid conduit may also be used as long as the shape does not hinder the making of connections to the process chamber. Each of the cooling fluid supply conduit (110-1) and the cooling fluid return conduit (110-2) may have a cooling fluid entry (111; 113) and a cooling fluid exit (112; 114) along the first axis (121). The cooling fluid exit (112) of the cooling fluid supply conduit (110-1) may be operably connected to the cooling fluid entry (113) of the cooling fluid return conduit (110-2). This may provide the advantage of continuous circulation of the cooling fluid in cooling fluid conduit. The connection between the cooling fluid exit (112) of the cooling fluid supply conduit (110-1) and the cooling fluid entry (113) of the cooling fluid return conduit (110-2) may be provided by a substantially bowed portion, the substantially bowed portion partially surrounding the injector tube (120). In some embodiments, the substantially bowed portion may be arc-shaped. Consequently, the cooling fluid supplied to the cooling fluid supply conduit (110-1) flows through the cooling fluid supply conduit from its inlet (111) to its exit (112) and then flows through the substantially bowed portion (115) before entering into the inlet (113) of the cooling fluid return conduit (110-2). The substantially bowed portion may be a part of the cooling fluid supply conduit (110-1) such that the cooling fluid supply conduit may be bent at its exit portion (112) and welded to the cooling fluid return conduit (110-2). This may advantageously allow for reducing leakage of the cooling fluid in the cooling fluid conduit (110).

In embodiments, the cooling fluid may be pumped into the cooling fluid supply conduit (110-1).

In some embodiments, the cooling fluid supply conduit may be operably connected to a cooling fluid tower, thereby allowing a supply of cooling fluid to the cooling fluid supply conduit (110-1) without the need for a pump. The positioning of the cooling fluid tower and the cooling fluid supply conduit (110-1) may be configured such that the cooling fluid may flow under the influence of gravity.

In embodiments, the cooling fluid supply conduit (110-1) may have a different thermal conductivity than the cooling fluid return conduit (110-2). The difference in thermal conductivity may help to balance the heat transfer between the injector tube (120) and the conduits (110) so that improved cooling of the injector tube (120) can be obtained.

In some embodiments, the thermal conductivity of the cooling fluid supply conduit (110-1) may be higher than the thermal conductivity of the cooling fluid return conduit (110-2). This may provide the advantage of improving heat transfer to the injector tube (120) by the incoming cooling fluid, thereby providing better cooling to the injector tube (120), while reducing heat transfer between the injector tube (120) and the cooling fluid in the return conduit (110-2), thereby reducing the risk of warming the injector tube (120) by the cooling fluid that may be warmed up after having flown through the supply conduit (110-1).

In embodiments, each of the cooling fluid supply conduit (110-1) and the cooling fluid return conduit (110-2) may be at least partially in thermal contact with the injector tube (120). This may advantageously allow for regulating the heat transfer between the conduits (110) and the injector tube (120).

In embodiments, where the cooling fluid supply conduit (110-1) and the cooling fluid return conduit (110-2) may be in undisrupted physical contact with the injector tube (120) along the first axis (121) in the longitudinal direction, it may then be considered that each of the cooling fluid supply conduit (110-1) and the cooling fluid return conduit (110-2) is in complete thermal contact with the injector tube (120).

In embodiments, the cooling fluid supply conduit (110-1) and the cooling fluid return conduit (110-2) may be attached to the injector tube (120) using at least one pair of support structures (125) (FIG. 2). The support structures (125) may allow for providing mechanical support for conduits (110). Each support piece of the at least one pair of support structures (125) may thus, be situated on either side of the injector tube (120) and physically connecting the conduits (110) to the injector tube (120). In some embodiments, each pair of the support structures (125) may be distributed at equal distance from each other along the first axis (121) in the longitudinal direction.

The support structures (125) may also enable the partial thermal contact between the conduits (110) and the injector tube (120). Thus, in some embodiments, the support structures (125) may be made from thermally conducting material.

In some embodiments, each one of the pair of support structures (125) positioned in between the injector tube and the cooling fluid supply conduit (110-1) may be made from thermally conducting material, while the complementary one of each of the pair of support structures (125) positioned in between the injector tube and the cooling fluid return conduit (110-2) may be made from thermally insulating material. This may enhance heat transfer in between the injector tube (120) and the cooling fluid supply conduit (110-1), while suppressing the heat transfer in between the injector tube (120) and the cooling fluid return conduit (110-2), so that the injector tube (120) does not get re-heated by the cooling fluid that may have been warmed up while flowing through the cooling fluid supply conduit (110-1).

In embodiments, the cooling fluid return conduit (110-2) may be insulated on its periphery. This may provide thermal isolation of the injector tube (120) from the cooling fluid return conduit (110-2). This may be advantageous for decoupling the heat that may be transferred from an inner environment of the process chamber to the cooling fluid flowing in the cooling fluid return conduit (110-2). In case such a decoupling is not provided, heat transferred to the cooling fluid flowing in the cooling fluid return conduit (110-2) from the inner environment of the process chamber may further be transferred to the process gas that is flowing through the injector tube (120). This may consequently have an adverse effect on the cooling efficiency of the gas injector that is provided by the cooling fluid.

We now return to FIGS. 3A and 3B showing schematically a front view and FIG. 4A showing schematically a top view of a multi-hole injector according to embodiments of the first aspect of the present disclosure.

In some embodiments, the diameter of the cooling fluid return conduit (110-2) may be larger than the diameter of the cooling fluid supply conduit (110-1). Each of the cooling fluid supply conduit (110-1) and the cooling fluid return conduit (110-2) may be partially surrounding the injector tube (120) and may be coaxially positioned with the injector tube (120). The cooling fluid supply conduit (110-1) may be positioned in between the injector tube (120) and the cooling fluid return conduit (110-2).

FIG. 3A and FIG. 3B schematically show a front view of a multi-hole gas injector (101, 102) the cooling fluid supply conduit (110-1) and the cooling fluid return conduit (110-2) partially surrounding the injector tube (120). Partially surrounding may imply that conduits (110) do not close up around the circumference of the injector tube (120) and that there may be an opening left along the first axis (121) in the longitudinal direction throughout the conduits (110). In other words, in embodiments, a side of the injector tube (120) comprising the plurality of process gas injection holes (124) may be at least partially uncovered along the first axis in the longitudinal direction for injecting the process gas to the process chamber along the second axis (127). The partially uncovered side of the injector tube is such that each of the plurality of process gas injection holes (124) is exposed to the ambient. When the gas injector (100) is placed in the process chamber of the semiconductor processing apparatus, the process gas injection holes (124) are then exposed to the ambient in the process chamber, whereby they inject the process gas from the injector tube (120), through the opening into the process chamber along the second axis (127).

In some embodiments, the opening may be a single uninterrupted opening (160) along the first axis (121) in the longitudinal direction as schematically represented in FIG. 3A. Thus, in some embodiments, the single uninterrupted opening may be a slit. In other words, the opening may be a long and narrow cut along a length of the cooling fluid conduits (110), thereby exposing each of the process gas injection holes (124) and the part of the injector tube in between the holes (124).

In some embodiments, the single uninterrupted opening (160) may be arc-shaped.

In some embodiments, the single opening may be interrupted by baffles (140), thereby creating a plurality of interrupted openings (161) along the first axis (121) in the longitudinal direction as schematically represented in FIG. 3B. Each one of the process gas injection holes (124) may be exposed to the ambient in between two neighboring baffles (140), through each of the interrupted openings (161). This may provide a uniform and directional flow of the process gas, in use, as it is being injected from the injector tube (120) to the process chamber. The baffles (140) may be positioned such that each of the process gas injection holes (124) appears equally distanced from the immediate baffle above and below.

In embodiments, each one of the plurality of interrupted openings (161) may have an arc-shape.

In embodiments, each of the plurality of arc-shaped interrupted openings (161) or arc-shaped single uninterrupted opening may have an opening angle ($\alpha$), with respect to the center line of the injector tube (120), in a range of 5° to 60°.

Opening angles towards the lower end of this range may provide the advantage of having a lower pressure drop in the gas injector while it will also offer ease in its fabrication. Opening angles towards the higher end of this range may allow for improved cooling to the injector tube.

We now return to FIG. 4B representing schematically a top view of a multi-hole gas injector according to some embodiments of the first aspect of the present disclosure.

In some embodiments, the cooling fluid supply conduit (110-1) may be in fluid communication with the cooling fluid return conduit (110-2). The cooling fluid supply conduit (110-1) may be suitable for providing a flow of the cooling fluid to the cooling fluid return conduit (110-2) through its wall. The flow of the cooling fluid from the cooling fluid supply conduit (110-1) to the cooling fluid return conduit (110-2) may thus, be continuous. This may be advantageous in providing a continuous cooling to the injector tube (120). This may thus, lead to shortening the time required for cooling the injector tube (120).

In embodiments, the wall of the cooling fluid supply conduit (110-1) may be made of a porous material. This may provide the advantage of keeping fluid communication between the cooling fluid supply conduit (110-1) and the cooling fluid return conduit (110-2).

In embodiments, the porous material may be a porous metal, a porous ceramic or a porous plastic. As known to persons skilled in the art, the porous ceramic material may comprise a heat-resistant porous material having a plurality of gaseous pores. The porous ceramic material may be in the form of honeycomb ceramics or ceramic foam having an open-cell structure, thereby allowing the cooling fluid flow through to the cooling fluid return conduit (110-2).

The porous metal may, in embodiments, be a metal foam.

In embodiments, the gas injector (100) may be constructed and arranged to evaporate, in use, the cooling fluid in the cooling fluid return conduit (110-2). This may be achieved by having the pressure in the cooling fluid return conduit (110-2) to be kept at a pressure lower than the vapor pressure of the cooling fluid. In this way, the cooling fluid entering into the cooling fluid return conduit (110-2) through the porous wall of the cooling fluid supply conduit (110-1) may evaporate, thereby providing the cooling effect for the injector tube (120).

In embodiments, the cooling fluid return conduit (110-2) may be connected to a pump in order to provide continuous exhaust the vaporized cooling fluid from the cooling fluid return conduit (110-2). This continuous exhausting of the cooling fluid return conduit (110-2) may be advantageous as the cooling fluid may be continuously supplied to the cooling fluid supply conduit (110-1), thereby leading to the continuous formation of the vaporized cooling fluid in the cooling fluid return conduit (110-2).

We now return to FIG. 4C representing schematically a top view of a multi-hole gas injector according to some embodiments of the first aspect of the present disclosure.

In some embodiments, a further conduit (170) that may be coaxially positioned in between the cooling fluid supply conduit (110-1) and the cooling fluid return conduit (110-2). The further conduit (170) may be operably connected to the process chamber. This may be advantageous in balancing the heat transfer between the cooling fluid return conduit (110-2) and the cooling fluid supply conduit (110-1) This further conduit (170) may, in embodiments, have the same pressure as that in the process chamber.

In embodiments, the gas injector may further comprise a heat shield on its periphery (not shown in the figures). In other words, the heat shield may be located on an outer wall of the cooling fluid return conduit (110-2). Use of a heat shield may be advantageous whenever there may be cooling provided inside the process chamber since it may help to reduce the heat flux. The heat shield may be partially fixed to the gas injector. In some embodiments, the heat shield is not physically attached to the gas injector such that it is loose from the gas injector.

In some embodiments, the heat shield may be a radiative heat shield.

In some embodiments, the heat shield may be a single heat shield.

In embodiments, the heat shield may be made from quartz or silicon carbide. These may be advantageous since they may absorb the radiation and reduce the flux to the cooler parts of the gas injector.

We now return to FIG. 5 and FIG. 6A representing schematically a front view and a top view of a dump gas injector (103) according to embodiments of the second aspect of the present disclosure.

The gas injector (103) may be constructed to deliver a process gas to a process chamber of a semiconductor processing apparatus. The gas injector (103) may comprise an injector tube (180) to inject a process gas to the process chamber. The injector tube (180) may extend along a first axis (121) in a longitudinal direction from a first end (122) to a second end (123), whereby the injector tube (120) may be constructed to receive the process gas and to inject the process gas to the process chamber substantially along the first axis (121).

In embodiments, the injector tube (180) may have a single opening (150) at its second end (123) to inject the process gas to the process chamber.

In embodiments, the injector tube (120) may comprise a feed end.

In embodiments, the feed end may be in fluid connection with a gas supply (130) constructed and arranged for providing one or more precursor gas to the injector tube (180). In embodiments, the feed end may be comprised in the first end (122) of the injector tube (180). The one or more precursor gas may make up the process gas. In embodiments where more than one precursor gas is supplied to the injector tube (180), the precursor gases may get mixed in the injector tube (180) before being injected into the process chamber.

Figure 6A:
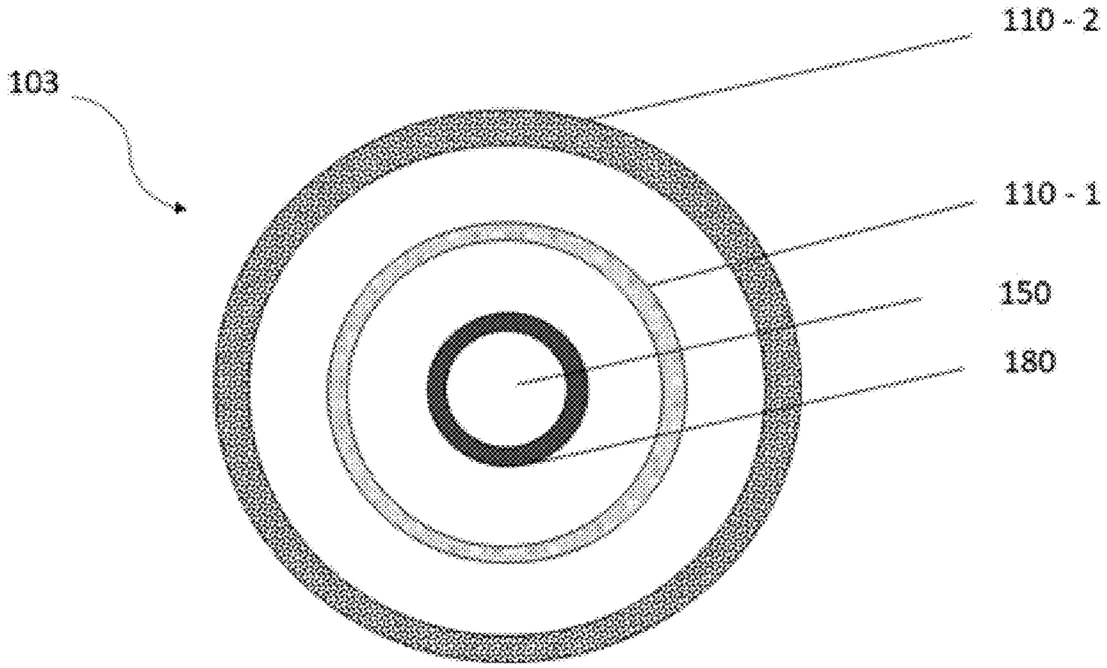

The gas injector (103) may further comprise a cooling fluid conduit (110-1; 110-2). The cooling fluid conduit may be constructed to cool the injector tube (180). The cooling fluid conduit may comprise a cooling fluid supply conduit (110-1) constructed and arranged to provide a cooling fluid and a cooling fluid return conduit (110-2) constructed and arranged to remove a cooling fluid. Each of the cooling fluid supply conduit (110-1) and the cooling fluid return conduit (110-2) may be coaxially positioned with the injector tube (180). The cooling fluid supply conduit (110-1) may be positioned in between the injector tube (180) and the cooling fluid return conduit (110-2) as schematically shown in FIG. 6A. Coaxial positioning may infer, in embodiments, to the injector tube (180) and the conduits (110-1; 110-2) sharing the same center point.

The gas injector (103) may offer the same advantages as the gas injector (100, 101, 102) disclosed according to embodiments of the first aspect of the present disclosure.

In embodiments, the gas injector (103) may comprise a plurality of injector tubes. This may advantageously allow for improving the thickness uniformity of the layer to be formed over the surface of each of the substrates that may be comprised in the substrate boat.

In some embodiments, the plurality of injector tubes may be aligned next to each other along a third axis (127), the third axis (127) being perpendicular to the first axis (121) and the second axis(126). It is to be noted that there is to be enough conduction between each of the plurality of the gas injectors (120) with one another such that the heat from the gas injectors (120) can be transferred to the cooling fluid conduits (110).

The cooling fluid conduits (110), such as, for example, the cooling fluid supply conduit (110-1) and the cooling fluid return conduit (110-2), may be positioned opposite to one another on each of the distal ends of the plurality of injector tubes (123) aligned next to each other.

The number of the injector tubes (123) that can be aligned next to each other may be configured such that there is provided enough cooling to each of the injector tubes (120). In some embodiments, there may be a need to place additional cooling fluid channels above and/or below the aligned injector tubes (120)

Figure 6B:
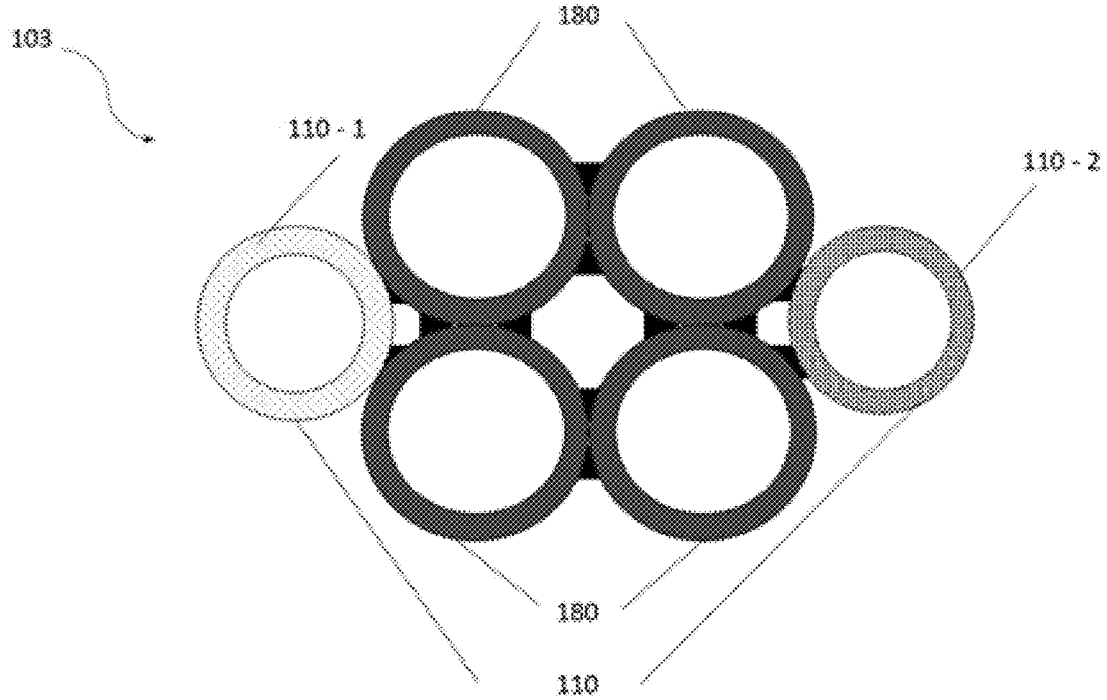

In some embodiments, the plurality of injector tubes (180) may be positioned in a matrix configuration. FIG. 6B represents schematically 2×2 matrix configuration for the plurality of injector tubes (180). For the formation of the layer on the substrates, where Atomic Layer Deposition (ALD) is to be performed, for example, matrix configuration of the plurality of injector tubes (180) may be a viable alternative.

The matrix configuration may be in the form of a×b matrix, with "a" representing the number of injector tubes (180) along the second axis (127) such as, for example, in a direction towards the substrate boat and "b" representing the number of injector tubes (180), aligned next to each other, along the first axis (121).

In embodiments, "a" may vary from 1 to 3, and "b" may vary from 1 to 10.

Figure 6C:
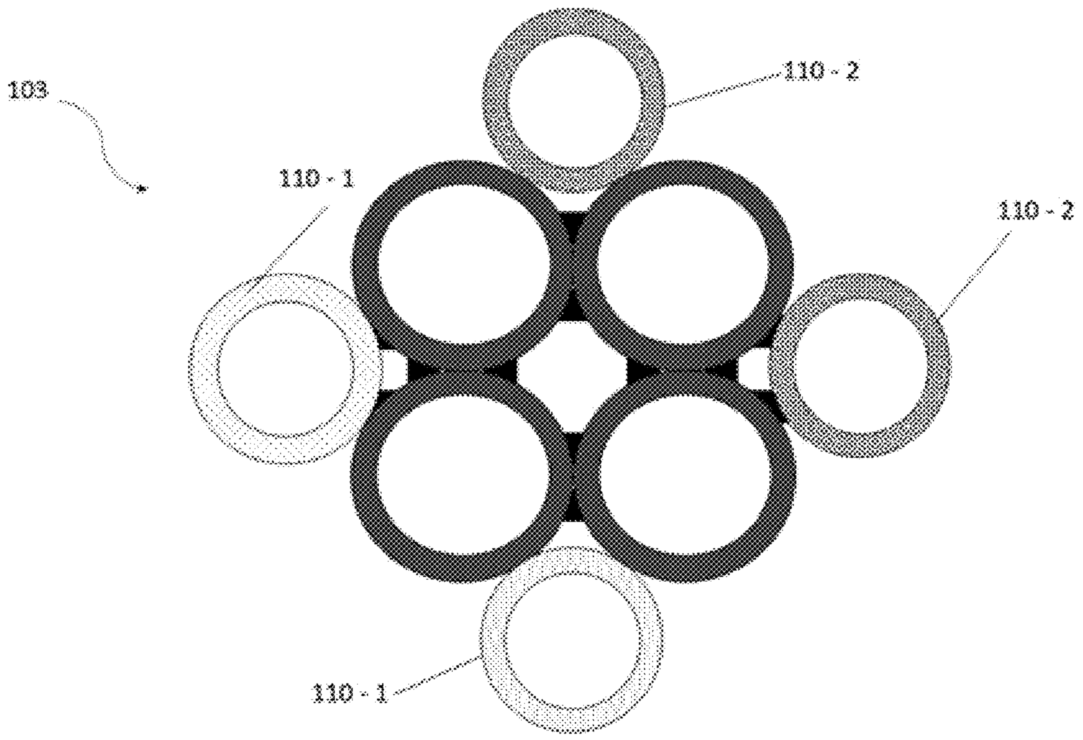

In some embodiments, additional cooling fluid conduits (110) may be placed on top of and under the plurality of injector tubes (180) arranged in the matrix configuration as schematically represented in FIG. 6C. The placement of such additional cooling fluid conduits may depend on the process temperature. For processes requiring a process temperature of such as, for example, above 600° C., use of additional cooling fluid conduits (110) may be advantageous for allowing faster and improved cooling.

Figure 6D:
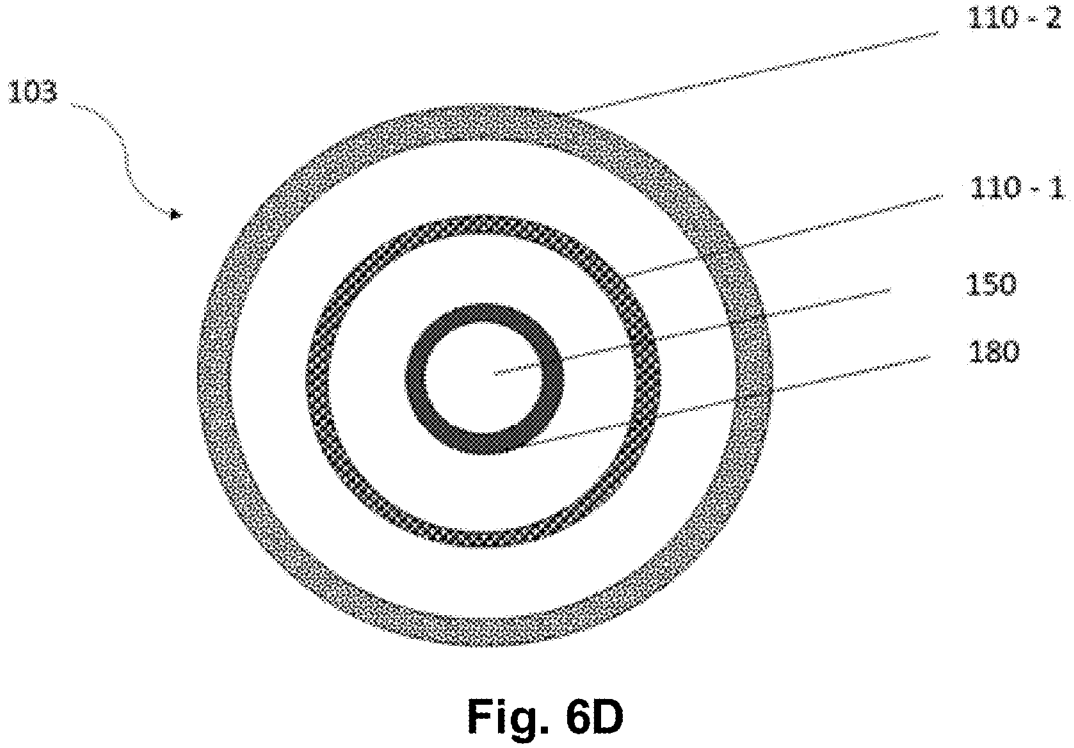

FIG. 6D represents schematically a top view of a dump gas injector, where in some embodiments, the cooling fluid supply conduit (110-1) may be in fluid communication with the cooling fluid return conduit (110-2). The cooling fluid supply conduit (110-1) may be suitable for providing a flow of the cooling fluid to the cooling fluid return conduit (110-2) through its wall. This may be advantageous in shortening the time required for cooling the injector tube (180).

In embodiments, the wall of the cooling fluid supply conduit (110-1) may be made of a porous material. This may provide the advantage of keeping fluid communication between the cooling fluid supply conduit (110-1) and the cooling fluid return conduit (110-2).

In embodiments, the porous material may be a porous metal, a porous ceramic or a porous plastic. As known to persons skilled in the art, the porous ceramic material may comprise a heat-resistant porous material having a plurality of gaseous pores. The porous ceramic material may be in the form of honeycomb ceramics or ceramic foam having an open-cell structure, thereby allowing the cooling fluid flow through to the cooling fluid return conduit (110-2).

The porous metal may, in embodiments, be a metal foam.

In embodiments, the gas injector (103) may be constructed and arranged to evaporate, in use, the cooling fluid in the cooling fluid return conduit (110-2). This may be achieved by having the pressure in the cooling fluid return conduit (110-2) to be kept at a pressure lower than the vapor pressure of the cooling fluid. In this way, the cooling fluid entering into the cooling fluid return conduit (110-2) through the porous wall of the cooling fluid supply conduit (110-1) may evaporate, thereby providing the cooling effect for the injector tube (180).

In embodiments, the cooling fluid return conduit (110-2) may be connected to a pump in order to provide continuous exhaust the vaporized cooling fluid from the cooling fluid return conduit (110-2). This continuous exhausting of the cooling fluid return conduit (110-2) may be advantageous as the cooling fluid may be continuously supplied to the cooling fluid supply conduit (110-1), thereby leading to the continuous formation of the vaporized cooling fluid in the cooling fluid return conduit (110-2).

Figure 6E:
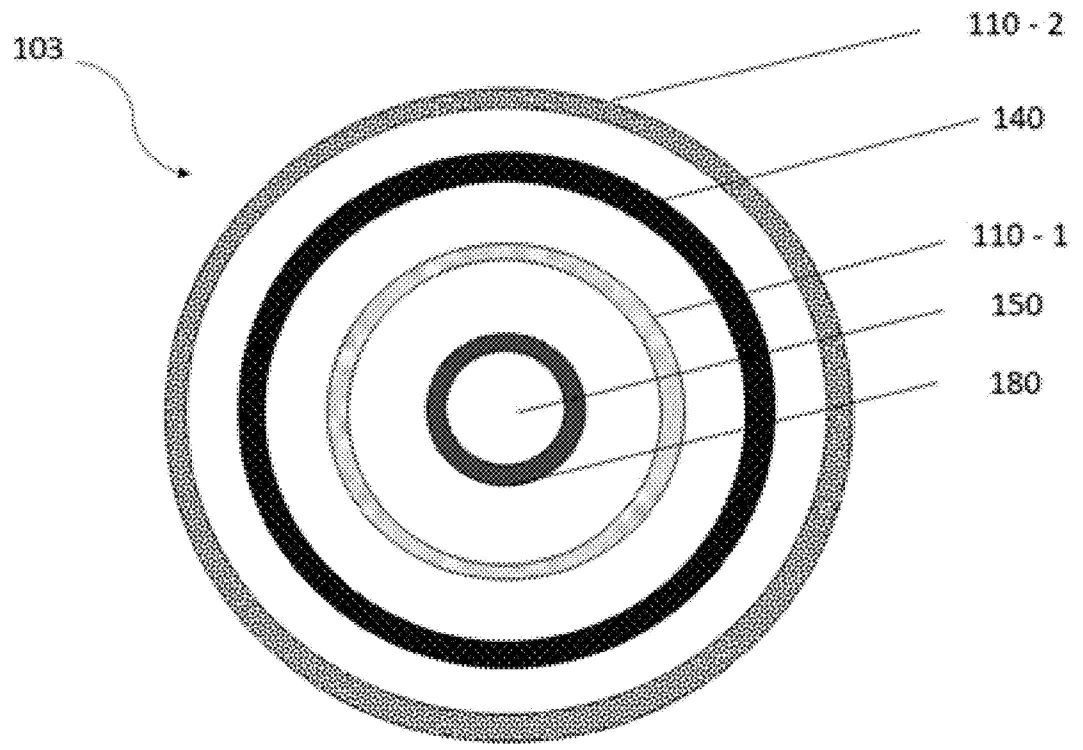

FIG. 6E represents schematically a top view of a dump gas injector, where in some embodiments, a further conduit (170) may be coaxially positioned in between the cooling fluid supply conduit (110-1) and the cooling fluid return conduit (110-2). The further conduit (170) may be operably connected to the process chamber. This may be advantageous in balancing the heat transfer between the cooling fluid return conduit (110-2) and the cooling fluid supply conduit (110-1) This further conduit (170) may, in embodiments, have the same pressure as that in the process chamber.

In embodiments, the gas injector may further comprise a heat shield on its periphery (not shown in the figures). In other words, the heat shield may be located on an outer wall of the cooling fluid return conduit (170). Use of a heat shield may be advantageous whenever there may be cooling provided inside the process chamber since it may help to reduce the heat flux. The heat shield may be partially fixed to the gas injector. In some embodiments, the heat shield is not physically attached to the gas injector such that it is loose from the gas injector.

In some embodiments, the heat shield may be a radiative heat shield.

In some embodiments, the heat shield may be a single heat shield.

In embodiments, the heat shield may be made from quartz or silicon carbide. These may be advantageous since they may absorb the radiation and reduce the flux to the cooler parts of the gas injector.

In a third aspect of the present disclosure, a semiconductor processing apparatus is disclosed.

The semiconductor processing apparatus (500) may comprise a process chamber (570). The process chamber (570) may extend in a longitudinal direction and may be constructed and arranged to receive a substrate boat (520). The substrate boat (520) may comprise a plurality of substrates (530). The semiconductor processing apparatus (500) may be provided with the gas injector (100, 101, 102, 103) according to embodiments of the first aspect or the second aspect of the present disclosure. Such a semiconductor processing apparatus (500) may be represented in FIG. 7.

In embodiments, the semiconductor processing apparatus (500) may also comprise a pedestal (540) onto which the substrate boat (520) rests. The semiconductor processing apparatus (500) may also comprise a heater suitable for heating and maintaining the process chamber at the process temperature. It may also comprise a pressure controller for attaining and maintaining the process pressure required in the process chamber. It may further comprise a gas supply (130) for providing one or more precursor gases into the gas injector (100, 101, 102,103). The gas supply may be connected to one or more precursor gas storage. The semiconductor processing apparatus (500) may also comprise a controller for executing instructions comprised in a non-transitory computer readable medium, and to cause the vertical furnace to process the plurality of substrates (530).

In embodiments, the semiconductor processing apparatus may be a vertical furnace. Processing the plurality of substrates in the vertical furnace may provide the advantage of decreasing the foot print of the apparatus in cleanroom floor space. The vertical furnace may be suitable for deposition processes such as chemical vapor deposition (CVD), atomic layer deposition (ALD), as well as oxidation, diffusion and annealing.

The embodiments of the present disclosure do not limit the scope of invention as these embodiments are defined by the claims appended herein and their legal equivalents. Any equivalent embodiments are intended to be within the scope of this invention. Modifications of the disclosure that are different from one another, in addition to those disclosed herein, may become apparent to those skilled in the art. Such modifications and the embodiments originating therefrom, are also intended to fall within the scope of the claims appended herein.

The invention claimed is:

1. A gas injector constructed to deliver a process gas to a process chamber of a semiconductor processing apparatus, the gas injector comprising:

an injector tube extending along a first axis in a longitudinal direction from a first end to a second end, the injector tube being constructed to receive the process gas and to inject the process gas to the process chamber along a second axis, the second axis being substantially perpendicular to the first axis; and a cooling fluid conduit constructed to cool the injector tube, the cooling fluid conduit comprising a cooling fluid supply conduit and a cooling fluid return conduit constructed and arranged to provide and remove a cooling fluid, wherein a diameter of the cooling fluid return conduit is larger than a diameter of the cooling fluid supply conduit and wherein each of the cooling fluid supply conduit and the cooling fluid return conduit partially surrounds the injector tube and is coaxially positioned with the injector tube, the cooling fluid supply conduit being positioned in between the injector tube and the cooling fluid return conduit.

2. The gas injector according to claim 1, wherein the injector tube comprises a plurality of process gas injection holes to inject the process gas to the process chamber along the second axis, the plurality of process gas injection holes being spaced apart from one another along the first axis in the longitudinal direction.

3. The gas injector according to claim 1, wherein the cooling fluid supply conduit is in fluid communication with the cooling fluid return conduit for providing a flow of the cooling fluid to the cooling fluid return conduit through a wall of the cooling supply conduit.

4. The gas injector according to claim 3, wherein the wall of the cooling fluid supply conduit is made of a porous material.

5. The gas injector according to claim 3, constructed and arranged to evaporate, in use, the cooling fluid in the cooling fluid return conduit.

6. The gas injector according to claim 1, wherein a further conduit is coaxially positioned in between the cooling fluid supply conduit and the cooling fluid return conduit, the further conduit being operably connected to the process chamber.

7. The gas injector according to claim 2, wherein a side of the injector tube comprising the plurality of process gas injection holes is at least partially uncovered along the first axis in the longitudinal direction for injecting the process gas to the process chamber along the second axis.

8. The gas injector according to claim 1, comprising a plurality of injector tubes.

9. The gas injector according to claim 1, further comprising a heat shield on its periphery.

10. A semiconductor processing apparatus comprising a process chamber extending in a longitudinal direction and being constructed and arranged to receive a substrate boat comprising a plurality of substrates; and the gas injector according to claim 1.

11. The semiconductor processing apparatus according to claim 10, wherein the apparatus is a vertical furnace.

12. The gas injector according to claim 1, wherein the cooling fluid conduit has an inverse-U shape, wherein each of the cooling fluid supply conduit and the cooling fluid return conduit has a cooling fluid entry and a cooling fluid exit along the first axis and wherein the cooling fluid exit of the cooling fluid supply conduit is operably connected to the cooling fluid entry of the cooling fluid return conduit.

13. The gas injector according to claim 1, wherein each of the cooling fluid supply conduit and the cooling fluid return conduit is at least partially in thermal contact with the injector tube.

14. The gas injector according to claim 1, wherein the cooling fluid return conduit is insulated on its periphery.

15. A gas injector constructed to deliver a process gas to a process chamber of a semiconductor processing apparatus, the gas injector comprising:

an injector tube extending along a first axis in a longitudinal direction from a first end to a second end, the injector tube being constructed to receive the process gas and to inject the process gas to the process chamber along a second axis, the second axis being substantially perpendicular to the first axis; and a cooling fluid conduit constructed to cool the injector tube, the cooling fluid conduit comprising a cooling fluid supply conduit and a cooling fluid return conduit constructed and arranged to provide and remove a cooling fluid, wherein a diameter of the cooling fluid return conduit is smaller than a diameter of the cooling fluid supply conduit and wherein each of the cooling fluid supply conduit and the cooling fluid return conduit is positioned on either side of the injector tube along the first axis in the longitudinal direction.

16. The gas injector according to claim 15, wherein the cooling fluid conduit has an inverse-U shape, wherein each of the cooling fluid supply conduit and the cooling fluid return conduit has a cooling fluid entry and a cooling fluid exit along the first axis and wherein the cooling fluid exit of the cooling fluid supply conduit is operably connected to the cooling fluid entry of the cooling fluid return conduit.

17. The gas injector according to claim 15, wherein the cooling fluid supply conduit has a different thermal conductivity than the cooling fluid return conduit.

18. The gas injector according to claim 15, wherein each of the cooling fluid supply conduit and the cooling fluid return conduit is at least partially in thermal contact with the injector tube.

19. The gas injector according to claim 15, wherein the cooling fluid return conduit is insulated on its periphery.

20. A gas injector constructed to deliver a process gas to a process chamber of a semiconductor processing apparatus, the gas injector comprising:

an injector tube to inject the process gas to the process chamber, the injector tube extending along a first axis in a longitudinal direction from a first end to a second end, whereby the injector tube is constructed to receive the process gas and to inject the process gas to the process chamber substantially along the first axis and wherein the gas injector further comprises a cooling fluid conduit constructed to cool the injector tube, the cooling fluid conduit comprising a cooling fluid supply conduit and a cooling fluid return conduit constructed and arranged to provide and to remove a cooling fluid, wherein each of the cooling fluid supply conduit and the cooling fluid return conduit is coaxially positioned with the injector tube, the cooling fluid supply conduit being positioned in between the injector tube and the cooling fluid return conduit, wherein a diameter of the cooling fluid return conduit is larger than a diameter of the cooling fluid supply conduit, and wherein each of the cooling fluid supply conduit and the cooling fluid return conduit partially surrounds the injector tube.

* * * * *